US008216765B2

(12) United States Patent
Morimitsu et al.

(10) Patent No.: US 8,216,765 B2
(45) Date of Patent: Jul. 10, 2012

(54) REIMAGEABLE AND REUSABLE MEDIUM AND METHOD OF PRODUCING AND USING THE REIMAGEABLE AND REUSABLE MEDIUM

(75) Inventors: Kentaro Morimitsu, Mississauga (CA); Tyler Norsten, Singapore (SG); Gabriel Iftime, Mississauga (CA); Peter M. Kazmaier, Mississauga (CA); Guerino Sacripante, Oakville (CA)

(73) Assignee: Xerox Corporation, Norwalk, CT (US)

( * ) Notice: Subject to any disclaimer, the term of this patent is extended or adjusted under 35 U.S.C. 154(b) by 681 days.

(21) Appl. No.: 12/400,276

(22) Filed: Mar. 9, 2009

(65) Prior Publication Data

US 2010/0227760 A1 Sep. 9, 2010

(51) Int. Cl.
*G03F 7/00* (2006.01)
*G03F 7/004* (2006.01)
*G03F 7/20* (2006.01)

(52) U.S. Cl. ....... 430/270.1; 430/19; 430/394; 430/396; 430/270.15

(58) Field of Classification Search ............... 430/270.1, 430/19, 394, 396, 270.15
See application file for complete search history.

(56) References Cited

U.S. PATENT DOCUMENTS 3,485,765 A 12/1969 Newland
3,486,899 A 12/1969 Brown
3,884,697 A 5/1975 Inoue et al.
3,918,972 A * 11/1975 Evens et al. .................. 430/337
3,961,948 A 6/1976 Saeva
4,026,869 A * 5/1977 Evens et al. .................. 528/185
4,365,012 A 12/1982 Hocker et al.
4,794,068 A 12/1988 Miyazaki et al.
5,266,447 A 11/1993 Takahashi et al.
5,360,699 A 11/1994 Hibino et al.
5,399,451 A 3/1995 Hashida et al.
5,710,420 A 1/1998 Martin et al.
5,879,438 A 3/1999 Fujita et al.
5,928,988 A 7/1999 Yamane et al.
5,962,177 A 10/1999 Sacripante et al.
6,067,185 A 5/2000 Albert et al.
6,103,431 A 8/2000 Tamaoki et al.
6,329,035 B1 12/2001 Iwasaki et al.
6,358,655 B1 3/2002 Foucher et al.
6,365,312 B1 4/2002 Foucher et al.
6,479,604 B1 * 11/2002 Kim et al. .................... 526/242
6,500,245 B1 12/2002 McCue et al.
6,902,860 B2 6/2005 Asawa et al.
7,166,420 B2 1/2007 Chopra et al.
7,202,006 B2 4/2007 Chopra et al.

(Continued)

OTHER PUBLICATIONS

Smets et al., "Some Photochemical Reactions in Solid Polymer Systems", J. Polymer Sci.: Symposium, No. 51, pp. 119-134, 1975.

(Continued)

*Primary Examiner* — Amanda C. Walke
(74) *Attorney, Agent, or Firm* — MH2 Technology Law Group LLP

(57) ABSTRACT

The present disclosure provides a reusable and reimageable medium including a substrate coated with a photochromic polymer. The photochromic polymer has a glass transition temperature ranging from 30° C. to 150° C., such as from about 30° C. to about 100° C., and the coated substrate converts to a colored state when both UV light and temperatures ranging from 30° C. up to 100° C. are applied to the coated substrate. The present disclosure also provides a method for producing and using the reusable and reimageable medium.

16 Claims, 5 Drawing Sheets

U.S. PATENT DOCUMENTS

| | | | | |
|---|---|---|---|---|
| 7,205,088 | B2 | 4/2007 | Iftime et al. | |
| 7,214,456 | B2 | 5/2007 | Iftime et al. | |
| 7,229,740 | B2 | 6/2007 | Iftime et al. | |
| 7,300,727 | B2 | 11/2007 | Kazmaier et al. | |
| 7,316,875 | B2 | 1/2008 | Iftime et al. | |
| 7,381,506 | B2 | 6/2008 | Iftime et al. | |
| 7,410,750 | B2 * | 8/2008 | Chopra et al. | 430/345 |
| 7,432,027 | B2 | 10/2008 | Chopra et al. | |
| 7,488,132 | B2 | 2/2009 | Shrader | |
| 7,498,122 | B2 | 3/2009 | Iftime et al. | |
| 7,541,119 | B2 | 6/2009 | Norsten et al. | |
| 7,666,558 | B2 * | 2/2010 | Iftime et al. | 430/19 |
| 2005/0244742 | A1 | 11/2005 | Iftime et al. | |
| 2005/0244743 | A1 | 11/2005 | Iftime et al. | |
| 2005/0244744 | A1 | 11/2005 | Kazmaier et al. | |
| 2005/0269556 | A1 * | 12/2005 | Evans et al. | 252/586 |
| 2006/0001944 | A1 * | 1/2006 | Chopra et al. | 359/265 |
| 2008/0110995 | A1 * | 5/2008 | Iftime et al. | 235/491 |
| 2008/0191136 | A1 | 8/2008 | Shrader et al. | |
| 2008/0311489 | A1 * | 12/2008 | Kazmaier et al. | 430/19 |
| 2008/0311491 | A1 | 12/2008 | Iftime et al. | |
| 2008/0311492 | A1 | 12/2008 | Iftime et al. | |
| 2008/0311493 | A1 | 12/2008 | Norsten et al. | |
| 2008/0311494 | A1 | 12/2008 | Norsten et al. | |
| 2008/0311495 | A1 | 12/2008 | Norsten et al. | |
| 2008/0311496 | A1 | 12/2008 | Iftime et al. | |
| 2008/0311516 | A1 | 12/2008 | Iftime et al. | |
| 2008/0311517 | A1 | 12/2008 | Iftime et al. | |
| 2008/0311518 | A1 | 12/2008 | Iftime et al. | |
| 2008/0311519 | A1 | 12/2008 | Kazmaier et al. | |
| 2008/0311521 | A1 | 12/2008 | Kazmaier et al. | |
| 2011/0092364 | A1 * | 4/2011 | Morimitsu et al. | 503/201 |
| 2011/0130279 | A1 * | 6/2011 | Iftime et al. | 503/201 |
| 2011/0215283 | A1 * | 9/2011 | Morimitsu et al. | 252/586 |

OTHER PUBLICATIONS

U.S. Appl. No. 12/145,412, filed Jun. 24, 2008.
U.S. Appl. No. 12/206,136, filed Sep. 8, 2008.
U.S. Appl. No. 11/762,327, filed Jun. 13, 2008.
U.S. Appl. No. 12/400,148, filed Mar. 9, 2009.
U.S. Appl. No. 12/400,147, filed Mar. 9, 2009.

* cited by examiner 2, 3, 3-TRIMETHYL-3H-INDOLE 3-(CHLOROMETHYL)-2-HYDROXY-5-NITROBENZALDEHYDE

2-HYDROXY-3-(HYDROXYMETHYL)-5-NITROBENZALDEHYDE

BIS-HYDROXYMETHYL PHOTOCHROMIC MONOMER

REIMAGEABLE AND REUSABLE MEDIUM AND METHOD OF PRODUCING AND USING THE REIMAGEABLE AND REUSABLE MEDIUM

TECHNICAL FIELD

This disclosure is generally directed to a reimageable and reusable medium and a method of producing and using the same. The reimageable and reusable media, according to the present disclosure, is a substrate composed of a photochromic polymer.

BACKGROUND

Conventional methods for producing xerographic reusable media entail coating a small photochromic molecule and a non-photochromic polymer binder to create a thin imaging layer of photochrome and binder on a preformed substrate, such as paper. The resulting media is re-writable and reusable as a result of the reversible coloration-decoloration properties of the photochromic molecule. In the conventional methods of imaging with conventional reusable media, ultraviolet (UV) light is used to color (or write) the photochrome in the media, and visible light and/or elevated temperatures reverses the coloration process, erasing the color of the photochrome within the media.

However, a disadvantage of the conventional reusable media is the length of time that the image is legible on conventional reusable media (i.e., the "image life" of the media). For example, U.S. Pat. No. 7,214,456 discloses a transient document system that has an image life of less than 4 hours under standard office lighting conditions, which may be too short for most applications.

Furthermore, U.S. Pat. No. 3,961,948 discloses an imaging method based upon visible light induced changes in a photochromic imaging layer containing a dispersion of at least one photochromic material in an organic film forming binder. Other known photochromic materials are disclosed in U.S. Pat. No. 4,026,869; U.S. Patent Application Publication No. 2005/0244742, filed Apr. 29, 2004; U.S. Patent Application Publication No. 2005/0244743, filed Apr. 29, 2004; U.S. Patent Application Publication No. 2005/0244744, filed Apr. 29, 2004; U.S. patent application Ser. No. 12/206,136, filed Sep. 8, 2008, the disclosures of which are incorporated by reference in their entireties.

Reusable media comprising other small molecule photochromes have been able to achieve only a slightly longer image life time (3-5 days), when the reusable media was directly imaged and then placed in (or under) a yellow film that serves to filter out the ambient UV light emitted by standard fluorescent office light bulbs (such as described in U.S. Patent Application Publication No. 2008/0311494, and U.S. patent application Ser. No. 12/145,412. However, if this reusable media is not placed under a protective yellow film, the standard image life was only approximately 4 hours, due to a reduction in color contrast resulting from background coloring. Furthermore, another disadvantage is that many consumers do not like the inconvenience of using the protective yellow film. The appropriate components and process aspects of each of the foregoing may be selected for the present disclosure in embodiments thereof, and the entire disclosure of the above-mentioned references are totally incorporated herein by reference.

SUMMARY

The present disclosure addresses the problems of image life and ambient background coloring in the conventional art, as described above. The present disclosure provides reusable and reimageable media that include a photochromic compound that is covalently bound to a polymer backbone. Thus, the photochromic properties of the photochromic moiety covalently bound within the polymer are dictated by the thermal properties of the polymer. By tuning the glass transition temperature (Tg) of the polymer, the resulting photochromic polymer materials can be made to have an extended image life with little or no reduction in color contrast (background coloration) due to ambient UV light. Therefore, the present disclosure provides a reusable, reimageable medium that eliminates the need for a protective yellow film (or dye-based top coating), which creates imaging problems (i.e. low optical densities during writing) and adds additional costs and processes. This approach requires that the media be imaged at or above the glass transition temperature to achieve maximal optical densities.

According to one aspect of the present disclosure, a reusable and reimageable medium includes a substrate coated with a photochromic polymer, wherein the photochromic polymer has a glass transition temperature ranging from about 30° C. to about 150° C., such as from about 30° C. to about 100° C., and wherein the coated substrate converts to a colored state when both UV light and temperatures ranging from about 30° C. to about 100° C. are applied to the coated substrate.

In another aspect of the present disclosure, a method of producing a reusable and reimageable medium includes coating a substrate with a photochromic polymer, wherein the photochromic polymer has a glass transition temperature ranging from about 30° C. to about 150° C., such as from about 30° C. to about 100° C., and wherein the coated substrate converts to a colored state when both UV light and temperatures ranging from about 30° C. to about 100° C. are applied to the coated substrate.

According to yet another aspect of the present disclosure, a method of using a reusable and reimageable medium includes applying both UV light and temperatures ranging from about 30° C. to about 100° C. to a substrate coated with a photochromic polymer, wherein the coated substrate converts to a colored state when both UV light and temperatures ranging from about 30° C. to about 100° C. are applied to the coated substrate, and wherein the coated substrate reverts to a colorless state at temperatures greater than about 70° C.

EMBODIMENTS

Figure 1:
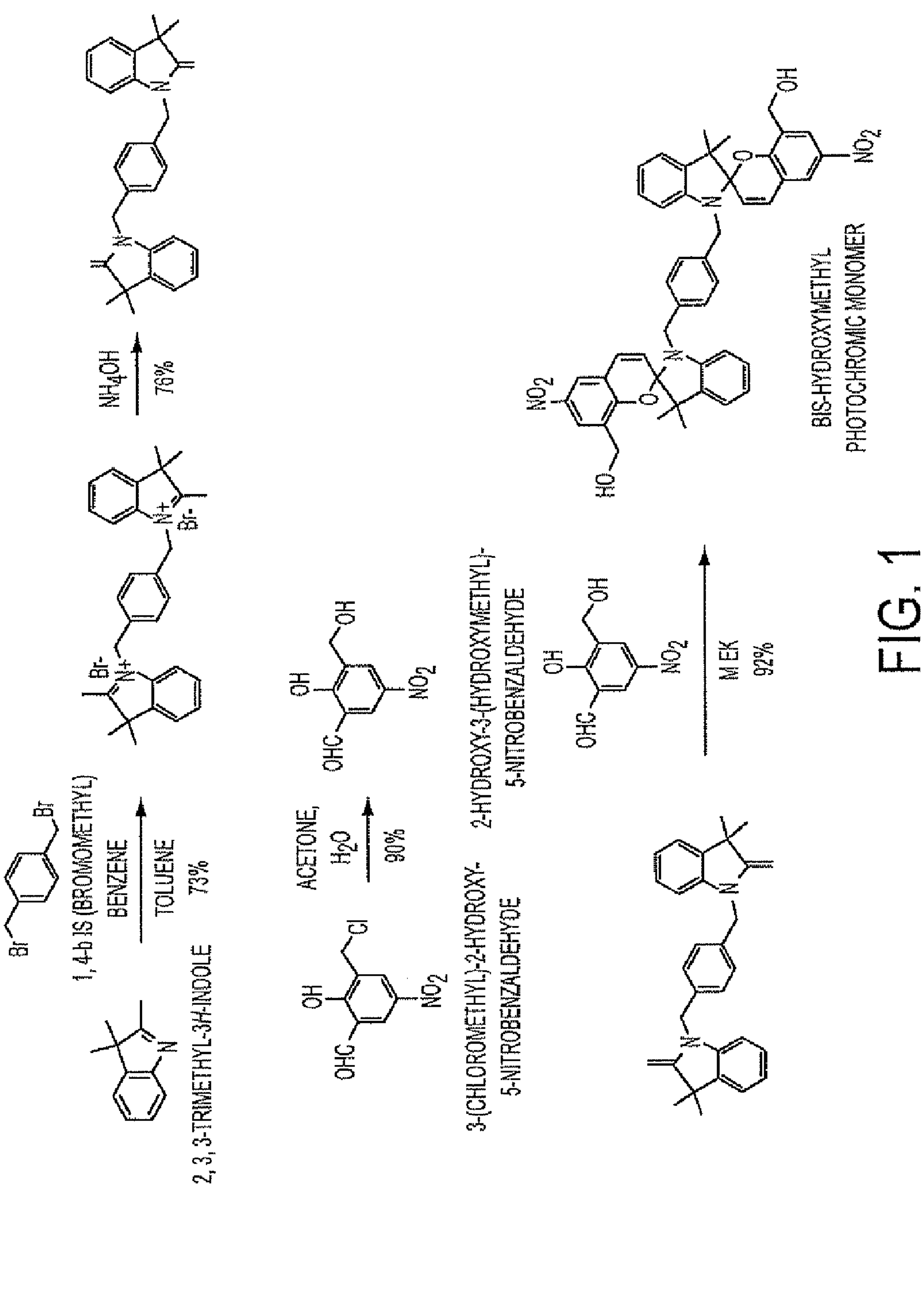
FIG. 1 shows the synthesis of a photochromic monomer.

Generally, in various exemplary embodiments, there is provided a reimageable and reusable paper or image forming medium formed using a composition that is imageable and erasable by suitable exposure to light and heat. The composition generally comprises a photochromic polymer, such that the composition exhibits a reversible transition between a colorless and a colored state. Exposing the imaging layer to a first stimulus such as a combination of UV light irradiation and heat causes the photochromic material in the photochromic polymer to convert from the colorless state to a colored state. Once the heat is removed, and because of the geometric structural forces exerted by the polymer chain, the photochromic material is more constrained against change, thus "locking in" the colored state for a longer period of time. Likewise, exposing the imaging layer to a second stimulus such as a combination of visible light irradiation and/or heat causes the photochromic material in the photochromic polymer to convert from the colored state to the colorless state. By a colored state, in embodiments, refers to for example, the presence or absorption of visible wavelengths; likewise, by a colorless state, in embodiments, refers to for example, the complete or substantial absence of visible wavelengths or the complete or substantial absence of absorption in the visible region of the spectrum (400-800 nanometers).

In the prior art, a trade-off has been between imaging duration, and energy required for image erase. Many photochromic compounds that require low levels of energy for erasing, have a short image lifetime, while other photochromic compounds that have a longer image lifetime, require higher levels of energy for erasing. For example, images formed from some photochromic compounds can be acceptably erased using strong visible light and heating to 160° C. within about 10 seconds, but the image has a duration of only about three days, which is too short for many applications. On the other hand, images formed from other photochromic compounds can acceptably have an image duration of one month or more, but the images can only be erased using strong visible light and heating to 160° C. in periods of time of two minutes or more, which is too long for many applications. Embodiments of this disclosure address these problems by using photochromic polymers where the image state can be locked in for extended periods of time, by constraining the physical rearrangement of the photochromic material between the colorless and colored states. That is, the more rigid structure of the polymer chain prevents the photochromic material from shifting between isomeric states, because the shifting requires a physical rearrangement of the polymer chain, and thus more energy. However, that physical rearrangement and resultant image change can be accomplished quickly when desired, by altering the polymer properties such as by heating.

According to the disclosure, writing of a photochromic reimageable paper can be accomplished by exposure to UV light at a specific range of temperatures, and erasure of a photochromic reimageable paper can be accomplished by applying elevated temperatures. However, in embodiments, heating of the photochromic polymer to at or near its glass transition temperature, in combination with exposure to UV light, allows the image to be written, as desired, in a short time period, ranging from about 30 milliseconds to about 1 minute. This is accomplished because the heating softens the polymer, allowing easier physical rearrangement of the polymer chain and the photochromic material. When the polymer is in the heated state, an image can be written by exposure to suitable irradiation such as UV light, followed by cooling of the polymer to lock in the image. Likewise, when the polymer is in the heated state, an image can be erased either by heating to a higher temperature, followed by cooling of the polymer to lock in the erased image. This erasing can thus be conducted in a short time period, ranging from 2-5 seconds at 100° C. and 4 minutes at 70° C.

Photochromism and thermochromism are defined as the reversible coloration of a molecule from exposure to light (electromagnetic radiation) and heat (thermal radiation) based stimuli respectively. Typically photochromic molecules undergo structural and/or electronic rearrangements when irradiated with UV light that converts them to a more conjugated colored state. In the case of photochromic molecules, the colored state can typically be converted back to their original colorless state by irradiating them with visible light. In some cases thermal energy can also be used to decolorize a photochrome. To create a stable reimageable document it is desired to stabilize the colored state, specifically to ambient conditions that the document will encounter in everyday life, such as broad band light and various heating/cooling conditions. However, it is also desirable that the compounds be capable of reversion back to the colorless state in a short time period, when erasing is desired.

In embodiments, the image forming medium generally comprises an imaging layer coated on or impregnated in a suitable substrate material, or sandwiched or laminated between a first and a second substrate material (i.e., a substrate material and an overcoat layer). The imaging layer in embodiments comprises a photochromic material, generally comprising a photochromic monomer bound into a polymer chain. The imaging composition is imageable by exposure to UV light at a particular ranges of temperatures, and erasable in a short time period by applying elevated temperatures, and exhibits a reversible transition between a colorless and a colored state.

Accordingly, in embodiments, the photochromic material can be readily converted from its colorless state to its colored state, or from its colored state to its colorless state, by exposure to suitable irradiation, such as a combination of light and heat. By "readily converted" herein is meant that the photochromic material can be converted from its one of its colored state or its colorless state to the other in a short time period, as described above. In contrast, the photochromic material is not readily converted from its colored state to its colorless state in a short time period, that is, the optical density of the imaging composition in the visible light range, such as about 580 nm, at 22° C. and 400 lux is not reduced from its initial optical density to one half its value within a time period of about 4 days, upon exposure visible light alone.

In one embodiment, the image forming material (photochromic polymer) is optionally dissolved or dispersed in any suitable carrier, such as a solvent, a polymer binder, or the like. Water may be used as a solvent for water soluble photochromic polymers and water soluble binders such as poly(vinyl alcohol) and poly(acrylic acid). Other suitable solvents include, for example, straight chain aliphatic hydrocarbons, branched chain aliphatic hydrocarbons, and the like, such as where the straight or branched chain aliphatic hydrocarbons have from about 1 to about 30 carbon atoms. For example, a non-polar liquid of the ISOPAR™ series (manufactured by the Exxon Corporation) may be used as the solvent. These hydrocarbon liquids are considered narrow portions of isoparaffinic hydrocarbon fractions. Other suitable solvent materials include, for example, the NORPAR™series of liquids, which are compositions of n-paraffins available from Exxon Corporation, the SOLTROL™ series of liquids available from the Phillips Petroleum Company, and the SHELLSOL™ series of liquids available from the Shell Oil Company. Mixtures of one or more solvents, i.e., a solvent system, can also be used, if desired. In addition, more polar solvents can also be used, if desired. Examples of more polar solvents that may be used include halogenated and nonhalogenated solvents, such as tetrahydrofuran, trichloro- and tetrachloroethane, dichloromethane, chloroform, monochlorobenzene, toluene, xylenes, acetone, methanol, ethanol, xylenes, benzene, ethyl acetate, dimethylformamide, cyclohexanone, N-methyl acetamide and the like. The solvent may be composed of one, two, three or more different solvents. When two or more different solvents are present, each solvent may be present in an equal or unequal amount by weight ranging for example from about 5% to 90%, particularly from about 30% to about 50%, based on the weight of all solvents.

If desired, the photochromic polymer can be dispersed in another, non-photochromic polymer binder. Such an additional polymer binder may be desired, for example, depending on the properties, characteristics, and the like of the photochromic polymer. Of course, it will be understood that an additional polymer binder may not be required in some embodiments, as the photochromic polymer can itself function as a binder material.

Suitable examples of polymer binders that can be used include, but are not limited to, polyalkylacrylates like polymethyl methacrylate (PMMA), polycarbonates, polyethylenes, oxidized polyethylene, polypropylene, polyisobutylene, polystyrenes, poly(styrene)-co-(ethylene), polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohol, polyacrylic acid, and the like. Copolymer materials such as polystyrene-acrylonitrile, polyethylene-acrylate, vinylidenechloride-vinylchloride, vinylacetate-vinylidene chloride, styrene-alkyd resins are also examples of suitable binder materials. The copolymers may be block, random, or alternating copolymers. In some embodiments, polymethyl methacrylate or a polystyrene is the polymer binder, in terms of their cost and wide availability. The polymer binder, when used, has the role to provide a coating or film forming composition.

Phase change materials can also be used as the polymer binder. Phase change materials are known in the art, and include for example crystalline polyethylenes such as Polywax® 2000, Polywax® 1000, Polywax® 500, and the like from Baker Petrolite, Inc.; oxidized wax such as X-2073 and Mekon wax, from Baker-Hughes Inc.; crystalline polyethylene copolymers such as ethylene/vinyl acetate copolymers, ethylene/vinyl alcohol copolymers, ethylene/acrylic acid copolymers, ethylene/methacrylic acid copolymers, ethylene/carbon monoxide copolymers, polyethylene-b-polyalkylene glycol wherein the alkylene portion can be ethylene, propylene, butylenes, pentylene or the like, and including the polyethylene-b-(polyethylene glycol)s and the like; crystalline polyamides; polyester amides; polyvinyl butyral; polyacrylonitrile; polyvinyl chloride; polyvinyl alcohol hydrolyzed; polyacetal; crystalline poly(ethylene glycol); poly (ethylene oxide); poly(ethylene therephthalate); poly (ethylene succinate); crystalline cellulose polymers; fatty alcohols; ethoxylated fatty alcohols; and the like, and mixtures thereof. When phase change materials are used as a binder, it is preferred that the photochromic composition (including photochromic polymer, binder and optional additives) is encapsulated or laminated.

As the photochromic polymer, any suitable polymer that has one or more photochromic molecules or compounds bound to the polymer backbone, can be used. Such photochromic polymer can have the photochromic molecules or compounds covalently bound to the polymer backbone within the polymer chain itself. Such groups can be introduced into the polymer chain, for example, by including the photochromic molecules or compounds during the polymer preparation process, such as in the form of reactive units, monomer units, or the like, or they can be added to an already formed non-photochromic polymer material through known chemical functionalization reactions.

Where multiple photochromic molecules or compounds are present in the polymer chain, the multiple photochromic molecules or compounds can be the same or different. Likewise, the photochromic polymer used in forming the imaging layer can include only one type of photochromic polymer, or can include a mixture of two or more different types of photochromic polymer (such as different photochromic polymers having different photochromic molecules or compounds in the polymer chain, or the same or different photochromic molecules or compounds in different polymer chains.

Because the photochromic polymer is converted between its colored and colorless states by the use of light and heat, the polymer and photochromic molecules or compounds are desirably selected such that the photochromic polymer has thermal properties that can withstand the elevated temperatures that may be used for forming or erasing images. For example, in one embodiment, the photochromic polymer is selected to have a glass transition temperature ranging from about 30° C. to about 150° C., such as about 30° C. to about 100° C., such that the coated substrate converts to a colored state when both UV light and temperatures within these ranges. Such glass transition temperatures allow the heat to soften the photochromic polymer to allow the photochromic molecules or compounds to convert their imaging state and to lock in that imaging state when the temperature is reduced and the polymer rehardens.

The photochromic molecules or compounds can be any suitable molecule or compound that can be bound into the polymer chain. Suitable photochromic molecules or compounds thus include, but are not limited to, spiropyrans, diethienylethenes, naphthopyrans, chromenes, fulgides, and the like, and mixtures thereof. Desirably, in embodiments, the photochromic molecule or compound is one that can easily rearrange in the photchromic polymer to alter the imaging state when exposed to suitable irradiation and heat, but which is more difficult to rearrange in the photochromic polymer to alter the imaging state when heat is removed. One particular example of a suitable photochromic compound is a monomer having the following formula:

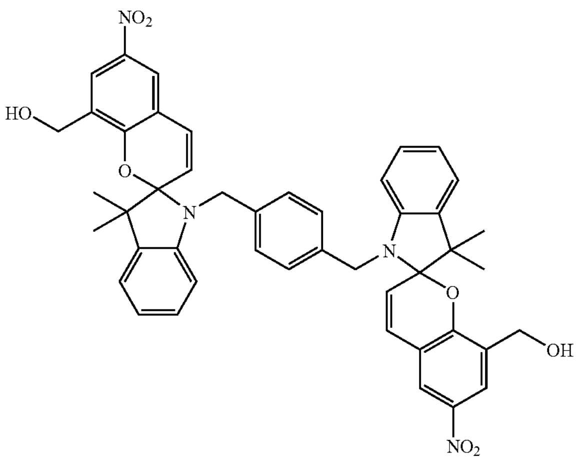

Likewise, any suitable non-photochromic polymer materials may be selected for forming the non-photochromic part of the photochromic polymer. Examples include, but are not limited to, the polymers described above as useful for a polymer binder. For example, in one embodiment, suitable polymers include those that can be formed from first and second monomers. The first monomer may be diacyl chlorides, diacids, its dimethyl esters, or its unhydrous cyclic esters such as oxalyl, malonyl, succinyl, glutaryl, adipoyl, pimeloyl, suberoyl, azelaoyl, sebacoyl, fumaryl, terephthalic, isophthalic, phthalic, and mixtures thereof, wherein the alkyl portion can be a straight, branched or cyclic, saturated or unsaturated, substituted or unsubstituted, from 1 to about 40 carbon atoms, an substituted or unsubstituted aromatic or heteroaromatic group. The second monomer may be bisphenols or diols such as Bis-phenol A, bisphenol B, bisphenol C, bisphenol F, bisphenol M, bisphenol P, bisphenol AP, bisphenol Z, ethylene glycol, propylene glycol, butylene glycol, pentylene glycol, hexylene glycol, heptylene glycoldiethylene glycol, dipropylene glycol, dipropylene glycol, cyclohexyldimethanol, bisphenol A ethoxylate, bisphenol A propoxylate, and mixtures thereof, wherein the alkyl portion can be a straight, branched or cyclic, saturated or unsaturated, substituted or unsubstituted, from 1 to about 40 carbon atoms, an substituted or unsubstituted aromatic or heteroaromatic group.

One particular example of a suitable photochromic polymer, formed from non-photochromic monomers and the above described photochromic monomer, is a photochromic polymer having the following general formula:

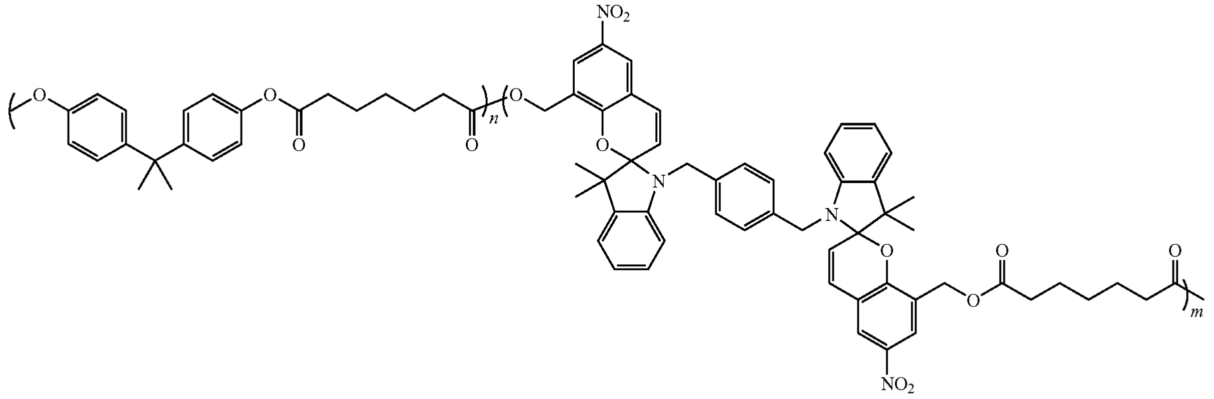

In embodiments, the imaging composition can be applied in one form, and dried to another form for use. Thus, for example, the imaging composition comprising photochromic polymer and solvent or polymer binder may be dissolved or dispersed in a solvent for application to or impregnation into a substrate, with the solvent being subsequently evaporated to form a dry layer.

In general, the imaging composition can include the binder and imaging material in any suitable amounts, such as from about 0.01 to about 99.5 percent by weight binder, such as from about 30 to about 90 percent by weight binder, and from about 0.05 to about 99.5 percent by weight photochromic polymer, such as from about 0.1 to about 70 percent photochromic polymer by weight. Of course, a binder may not be present (in this case, the photochromic polymer alone may be used).

For applying the imaging layer to the image forming medium substrate, the image forming layer composition can be applied in any suitable manner. For example, the image forming layer composition can be mixed and applied with any suitable solvent or polymer binder, and subsequently hardened or dried to form a desired layer. Further, the image forming layer composition can be applied either as a separate distinct layer to the supporting substrate, or it can be applied so as to impregnate into the supporting substrate.

The image forming medium may comprise a supporting substrate, coated or impregnated on at least one side with the imaging layer. As desired, the substrate can be coated or impregnated on either only one side, or on both sides, with the imaging layer. When the imaging layer is coated or impregnated on both sides, or when higher visibility of the image is desired, an opaque layer may be included between the supporting substrate and the imaging layer(s) or on the opposite side of the supporting substrate from the coated imaging layer. Thus, for example, if a one-sided image forming medium is desired, the image forming medium may include a supporting substrate, coated or impregnated on one side with the imaging layer and coated on the other side with an opaque layer such as, for example, a white layer. Also, the image forming medium may include a supporting substrate, coated or impregnated on one side with the imaging layer and with an opaque layer between the substrate and the imaging layer. If a two-sided image forming medium is desired, then the image forming medium may include a supporting substrate, coated or impregnated on both sides with the imaging layer, and with at least one opaque layer interposed between the two coated imaging layers. Of course, an opaque supporting substrate, such as conventional paper, may be used in place of a separate supporting substrate and opaque layer, if desired.

Any suitable supporting substrate may be used. For example, suitable examples of supporting substrates include, but are not limited to, glass, ceramics, wood, plastics, paper, fabrics, textile products, polymeric films, inorganic substrates such as metals, and the like. The plastic may be for example a plastic film, such as polyethylene film, polyethylene terephthalate, polyethylene naphthalate, polystyrene, polycarbonate, polyethersulfone. The paper may be, for example, plain paper such as XEROX® 4024 paper, ruled notebook paper, bond paper, silica coated papers such as Sharp Company silica coated paper, Jujo paper, and the like. The substrate may be a single layer or multi-layer where each layer is the same or different material. In embodiments, the substrate has a thickness ranging for example from about 0.3 mm to about 5 mm, although smaller or greater thicknesses can be used, if desired.

When an opaque layer is used in the image forming medium, any suitable material may be used. For example, where a white paper-like appearance is desired, the opaque layer may be formed from a thin coating of titanium dioxide, or other suitable material like zinc oxide, inorganic carbonates, and the like. The opaque layer can have a thickness of, for example, from about 0.001 mm to about 10 mm, such as about 0.1 mm to about 5 mm, although other thicknesses can be used.

If desired, a further overcoating layer may also be applied over the applied imaging layer. The further overcoating layer may, for example, be applied to further adhere the underlying layer in place over the substrate, to provide wear resistance, to improve appearance and feel, and the like. The overcoating layer can be the same as or different from the substrate material, although in embodiments at least one of the overcoating layer and substrate layer is clear and transparent to permit visualization of the formed image. The overcoating layer can have a thickness of, for example, from about 0.001 mm to about 10 mm, such as about 0.1 mm to about 5 mm, although other thicknesses can be used. For example, if desired or necessary, the coated substrate can be laminated between supporting sheets such as plastic sheets.

In embodiments where the imaging material is coated on or impregnated into the substrate, the coating can be conducted by any suitable method available in the art, and the coating method is not particularly limited. For example, the imaging material can be coated on or impregnated into the substrate by dip coating the substrate into a solution of the imaging material composition followed by any necessary drying, or the substrate can be coated with the imaging composition to form a layer thereof. Similarly, the protective coating can be applied by similar methods.

Where the photochromic polymer is mixed with a solvent applied on the substrate, and where the solvent system is retained in the final product, additional processing may be required. As a result, where the photochromic polymer is simply coated on the substrate, a cover material is generally applied over the solvent system to constrain the solvent system in place on the substrate. Thus, for example, the cover material can be a solid layer, such as any of the suitable materials disclosed above for the substrate layer. In an alternative embodiment, a polymer material or film may be applied over the photochromic polymer, where the polymer film penetrates the photochromic polymer at discrete points to in essence form pockets or cells of imaging material that are bounded on the bottom by the substrate and on the sides and top by the polymeric material. The height of the cells can be, for example, from about 1 micron to about 1000 microns, although not limited thereto. The cells can be any shape, for example square, rectangle, circle, polygon, or the like. In these embodiments, the cover material is advantageously transparent and colorless, to provide the full color contrast effect provided by the photochromic polymer.

In another embodiment, the solvent system with the photochromic polymer can be encapsulated or microencapsulated, and the resultant capsules or microcapsules deposited or coated on the substrate as described above. Any suitable encapsulation technique can be used, such as simple and complex coacervation, interfacial polymerization, in situ polymerization, phase separation processes. For example, a suitable method if described for ink materials in U.S. Pat. No. 6,067,185, the entire disclosure of which is incorporated herein by reference and can be readily adapted to the present disclosure. Useful exemplary materials for simple coacervation include gelatin, polyvinyl alcohol, polyvinyl acetate and cellulose derivatives. Exemplary materials for complex coacervation include gelatin, acacia, acrageenan, carboxymethylecellulose, agar, alginate, casein, albumin, methyl vinyl ether-co-maleic anhydride. Exemplary useful materials for interfacial polymerization include diacyl chlorides such as sebacoyl, adipoyl, and di or poly-amines or alcohols and isocyanates. Exemplary useful materials for in situ polymerization include for example polyhydroxyamides, with aldehydes, melamine or urea and formaldehyde; water-soluble oligomers of the condensate of melamine or urea and formaldehyde, and vinyl monomers such as for example styrene, methyl methacrylate and acrylonitrile. Exemplary useful materials for phase separation processes include polystyrene, polymethylmethacrylate, polyethylmethacrylate, ethyl cellulose, polyvinyl pyridine and polyacrylonitrile. In these embodiments, the encapsulating material is also transparent and colorless, to provide the full color contrast effect provided by the photochromic material.

Where the photochromic polymer is encapsulated, the resultant capsules can have any desired average particle size. For example, suitable results can be obtained with capsules having an average size of from about 2 to about 1000 microns, such as from about 10 to about 600 or to about 800 microns, or from about 20 to about 100 microns, where the average size refers to the average diameter of the microcapsules and can be readily measured by any suitable device such as an optical microscope. For example, in embodiments, the capsules are large enough to hold a suitable amount of photochromic material to provide a visible effect when in the colored form, but are not so large as to prevent desired image resolution.

In its method aspects, the present disclosure involves providing an image forming medium comprised of a substrate and an imaging layer comprising a photochromic polymer dispersed in a solvent or another polymeric binder, wherein the imaging composition is imageable by light and heat and erasable in a short time period by applying elevated temperatures, and exhibits a reversible transition between a colorless and a colored state. To provide separate writing and erasing processes, imaging is conducted by applying a first stimulus, such as UV light irradiation at a specific range of temperatures, to the imaging material to cause a color change. The preferred temperature range for the writing process is from 30° C. up to 150° C., such as from 30° C. up to 100° C. Erasing is conducted by applying a second, different stimulus, such as applying elevated temperatures, to the imaging material to reverse the color change in a short time period. The preferred temperature range for the erasing process is 70° C. and above.

In a writing process, the image forming medium is exposed to an imaging light having an appropriate activating wavelength, such as a UV light source such as a light emitting diode (LED), in an imagewise fashion. The imaging light supplies sufficient energy to the photochromic material to cause the photochromic material to convert, such as isomerize, from a clear state to a colored state to produce a colored image at the imaging location, and for the photochromic material to isomerize to stable isomer forms to lock in the image. The amount of energy irradiated on a particular location of the image forming medium can affect the intensity or shade of color generated at that location. Thus, for example, a weaker intensity image can be formed by delivering a lesser amount of energy at the location and thus generating a lesser amount of colored photochromic unit, while a stronger intensity image can be formed by delivering a greater amount of energy to the location and thus generating a greater amount of colored photochromic unit. When suitable photochromic material, solvent or polymer binder, and irradiation conditions are selected, the variation in the amount of energy irradiated at a particular location of the image forming medium can thus allow for formation of grayscale images, while selection of other suitable photochromic materials can allow for formation of full color images.

Once an image is formed by the writing process, the formation of stable isomer forms of the photochromic material within the imaging materials locks in the image. That is, the isomer forms of the selected photochromic materials are more stable to ambient heat and light, and thus exhibit greater long-term stability. The image is thereby "frozen" or locked in, and cannot be readily erased in the absence of a specific second stimuli such as applying elevated temperatures, particularly in a short time period. In embodiments, the image is locked in, and requires elevated temperature and/or light in order to revert back to the colorless state. The imaging substrate thus provides a reimageable substrate that exhibits a long-lived image lifetime, but which can be erased as desired and reused for additional imaging cycles.

The erasing process causes the isomerizations to reverse and the photochromic unit to convert, such as isomerize, from a colored state to a clear state to erase the previously formed image at the imaging location in a short time period. The erasing procedure can be on an image-wise fashion or on the entire imaging layer as a whole, as desired.

The separate imaging lights used to form the transient image and erase the transient image may have any suitable predetermined wavelength scope such as, for example, a single wavelength or a band of wavelengths. In various exemplary embodiments, the imaging lights are an ultraviolet (UV) light and a visible light each having a single wavelength or a narrow band of wavelengths. For example, the UV light can be selected from the UV light wavelength range of about 200 nm to about 475 nm, such as a single wavelength at about 365 nm or a wavelength band of from about 350 nm to about 370 nm. For forming the image, the image forming medium may be exposed to the respective imaging or erasing light for a time period ranging from about 10 milliseconds to 5 minutes, particularly from about 30 milliseconds to about 1 minute. The imaging light may have an intensity ranging from about 0.1 $mW/cm^2$ to about 100 $mW/cm^2$, particularly from about 0.5 $mW/cm^2$ to about 40 $mW/cm^2$.

The erasing light is a strong visible light of a wavelength which overlaps with the absorption spectrum of the colored state isomer in the visible region. For example the erasing useful light may have a wavelength ranging from about 400 nm to about 800 nm, such as from about 500 nm to about 800 nm. The usable Visible light of the erasing may be obtained form a Xenon light source with a bulb having a power from 5 W to about 1000 W, such as from about 20 W to about 200 W, which is placed in the proximity of the areas of the document which is to be erased. Another suitable erasing light source is an LED having a wavelength in the visible region of the light spectrum, as defined above. The erasing light may be having a single wavelength or a narrow band of wavelengths.

In various exemplary embodiments, imaging light corresponding to the predetermined image may be generated for example by a computer or a Light Emitting Diode (LED) array screen and the image is formed on the image forming medium by placing the medium on or in proximity to the LED screen for the desired period of time. In other exemplary embodiments, a UV Raster Output Scanner (ROS) may be used to generate the UV light in an image-wise pattern. This embodiment is particularly applicable, for example, to a printer device that can be driven by a computer to generate printed images in an otherwise conventional fashion. That is, the printer can generally correspond to a conventional inkjet printer, except that the inkjet printhead that ejects drops of ink in the imagewise fashion can be replaced by a suitable UV light printhead that exposes the image forming medium in an imagewise fashion. In this embodiment, the replacement of ink cartridges is rendered obsolete, as writing is conducted using a UV light source. The printer can also include a heating device, which can be used to apply heat to the imaging material to erase any existing images. Other suitable imaging techniques that can be used include, but are not limited to, irradiating a UV light onto the image forming medium through a mask, irradiating a pinpoint UV light source onto the image forming medium in an imagewise manner such as by use of a light pen, and the like. Furthermore, various transient documents printers are known in the art may be used, for example, U.S. patent application Ser. No. 11/762,327 filed Jun. 13, 2007, and U.S. Patent Application Publication No. 2008/0191136 filed Feb. 13, 2007, and U.S. patent application Ser. No. 12/400,148 filed Sep. 9, 2010, now issued as U.S. Pat. No. 8,113,646 and U.S. patent application Ser. No. 12/400,147 filed Sep. 9, 2010, now issued as U.S. Pat. No. 7,935,463, the disclosures of which are incorporated by reference in their entireties.

For erasing an image in order to reuse the imaging substrate, in various exemplary embodiments, the substrate can be exposed to elevated temperatures, to cause the image to be erased. Such erasure can be conducted in any suitable manner, such as by exposing the entire substrate to elevated temperatures. In other embodiments, erasing can be conducted at particular points on the substrate, such as by using a light pen and focused heat source, or the like.

According to various exemplary implementations, the color contrast that renders the image visible to an observer may be a contrast between, for example two, three or more different colors. The term "color" may encompass a number of aspects such as hue, lightness and saturation, where one color may be different from another color if the two colors differ in at least one aspect. For example, two colors having the same hue and saturation but are different in lightness would be considered different colors. Any suitable colors such as, for example, red, white, black, gray, yellow, cyan, magenta, blue, and purple, can be used to produce a color contrast as long as the image is visible to the naked eye of a user. However, in terms of desired maximum color contrast, a desirable color contrast is a dark gray or black image on a light or white background, such as a gray, dark gray, or black image on a white background, or a gray, dark gray, or black image on a light gray background.

In various exemplary embodiments, the color contrast may change such as, for example, diminish during the visible time, but the phrase "color contrast"may encompass any degree of color contrast sufficient to render an image discernable to a user regardless of whether the color contrast changes or is constant during the visible time.

An example is set forth hereinbelow and is illustrative of different compositions and conditions that can be utilized in practicing the disclosure. All proportions are by weight unless otherwise indicated. It will be apparent, however, that the disclosure can be practiced with many types of compositions and can have many different uses in accordance with the disclosure above and as pointed out hereinafter.

EXAMPLES

Example 1

FIG. 1 shows the synthesis of a bis-hydroxylmethyl photochromic monomer. U.S. Pat. Nos. 4,026,869 and 3,918,972 describe the synthesis in detail, the disclosure of which is incorporated by reference in its entirety. In one embodiment of this synthesis, 34.4 g of α,α'-dibromoparaxylene and 41.5 g of 2,3,3-trimethyl-indolenine together with 400 milliliter of toluene were refluxed while stirring for 1 day. After cooling the precipitate was filtered and washed with acetone to yield α, α'-bis[2,3,3-trimethyl-3H-indolium-yl(1)]-p-xylene-dibromide.

25 g of the latter product was dissolved in 500 ml of water. After addition of 60 ml of ammonium hydroxide the solution was treated with ether and dried over magnesium sulphate. The ether was evaporated. After triturated in cold ether a white precipitate of α,α'-bis[2-methylene-3,3-dimethylindolinyl (1)]-p-xylene formed, which was filtered off.

9.6 g of the latter product and 9.0 g of 4-hydroxymethyl-5-nitro-salicylaldehyde were dissolved in 250 ml of methyl ethyl ketone (MEK) and the solution was refluxed for 4 hours, whereafter the methyl ethyl ketone was distilled off. The residue was dissolved in dichloromethane and washed with aqueous NaHCO3 solution, then dried over magnesium sulphate. After the solvent was distilled off bis-hydroxymethyl photochrome was obtained.

Figure 2:
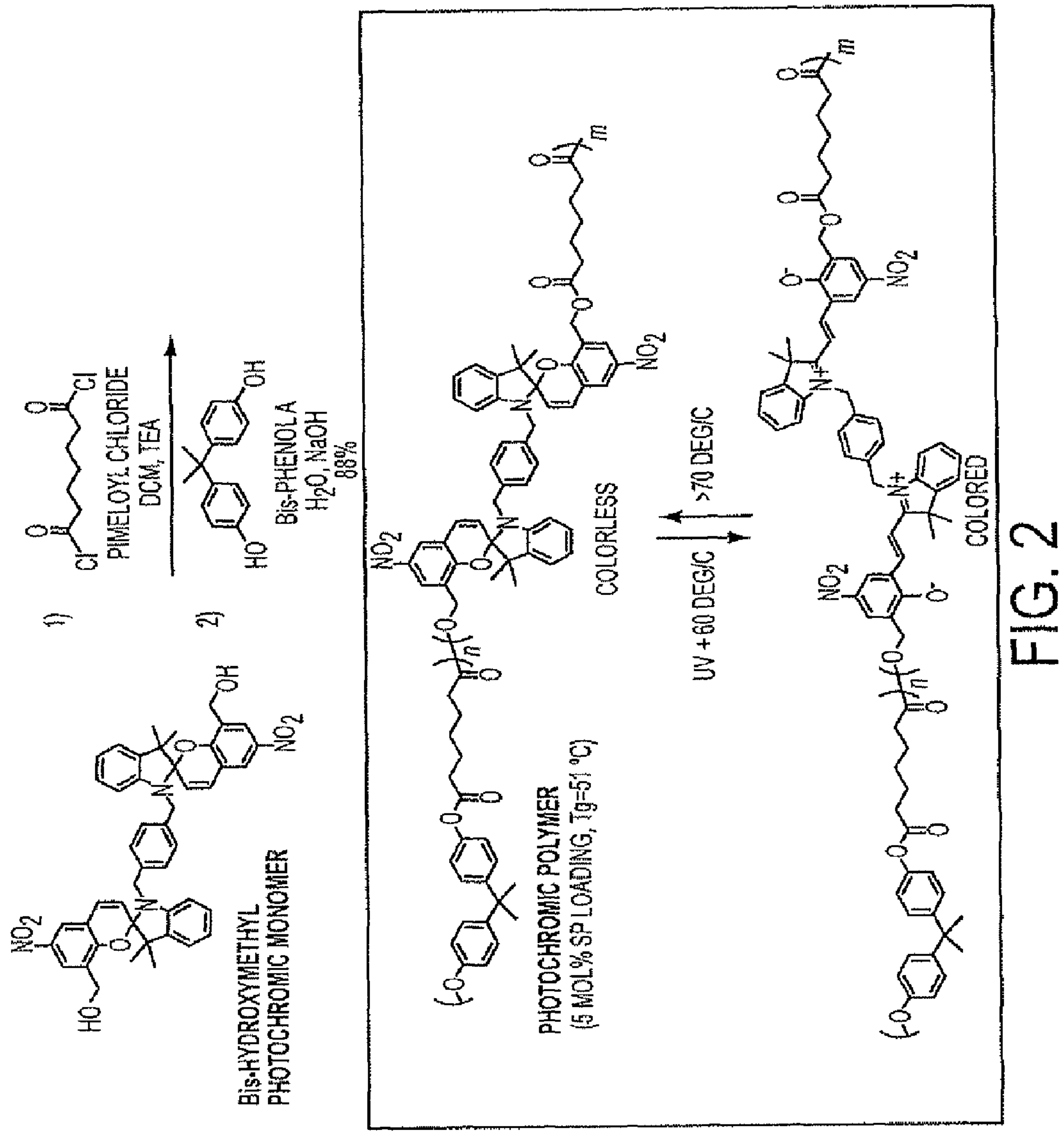
FIG. 2 shows the synthesis of a photochromic polymer from the co-polymerization of the photochromic monomer in FIG. 1.
Figure 3:
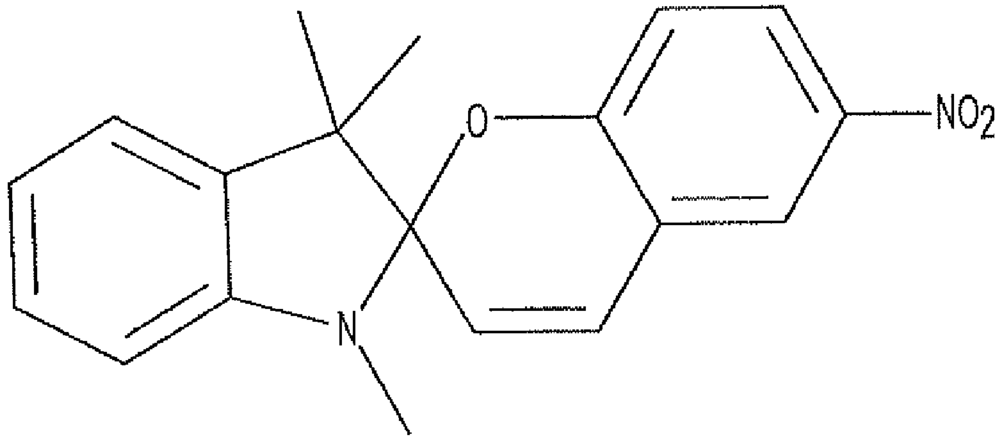
FIG. 3 shows a small-molecule spiropyran.

FIG. 2 shows the synthesis of a photochromic polymer from the co-polymerization of the bis-hydroxymethyl photochrome monomer (described above). The bis-hydroxymethyl photochrome monomer is reacted with pimeloyl chloride (dissolved in dichloromethane and triethylamine), then polymerized with Bis-Phenol A (dissolved in an aqueous sodium hydroxide solution) in the presence of Aliquat 336 as a catalyst to form a photochromic polyester, as shown in FIG. 2. As shown in FIG. 3, the photochromic polyester has a glass transition temperature of 51° C. When the photochromic polyester is exposed to both UV light and temperatures ranging from about 40° C. to about 70° C., the photochromic polyester converts from a colorless state to a colored state. When the photochromic polyester is exposed to temperatures greater than 70° C., the photochromic polyester reverts back from a colored state to a colorless state. According to an embodiment of the present disclosure, the particularly desirable monomer ratios of the photochromic monomer range from 0.05 mol % to 100 mol %. In the polymerization reaction shown in FIG. 2, the ratio of pimeloyl chloride to the photochromic monomer and bisphenol A must be 1:1. Therefore, photochromic monomer ratio determines the ratio of the other monomers. In the photochromic polyester in FIG. 2, the value of m may range from 1 to 1000, and the value of n may range from 0 to 1000. In an alternative embodiment, the BisPhenol A copolymer segment n and the photochromic copolymer segment m (shown in the photochromic polyester in FIG. 2) may be combined as a random or block copolymer. Thus, the combination of copolymer segments of the disclosed photochromic polyester is not limited to the specific combination shown in the photochromic polyester in FIG. 2.

Figure 4:
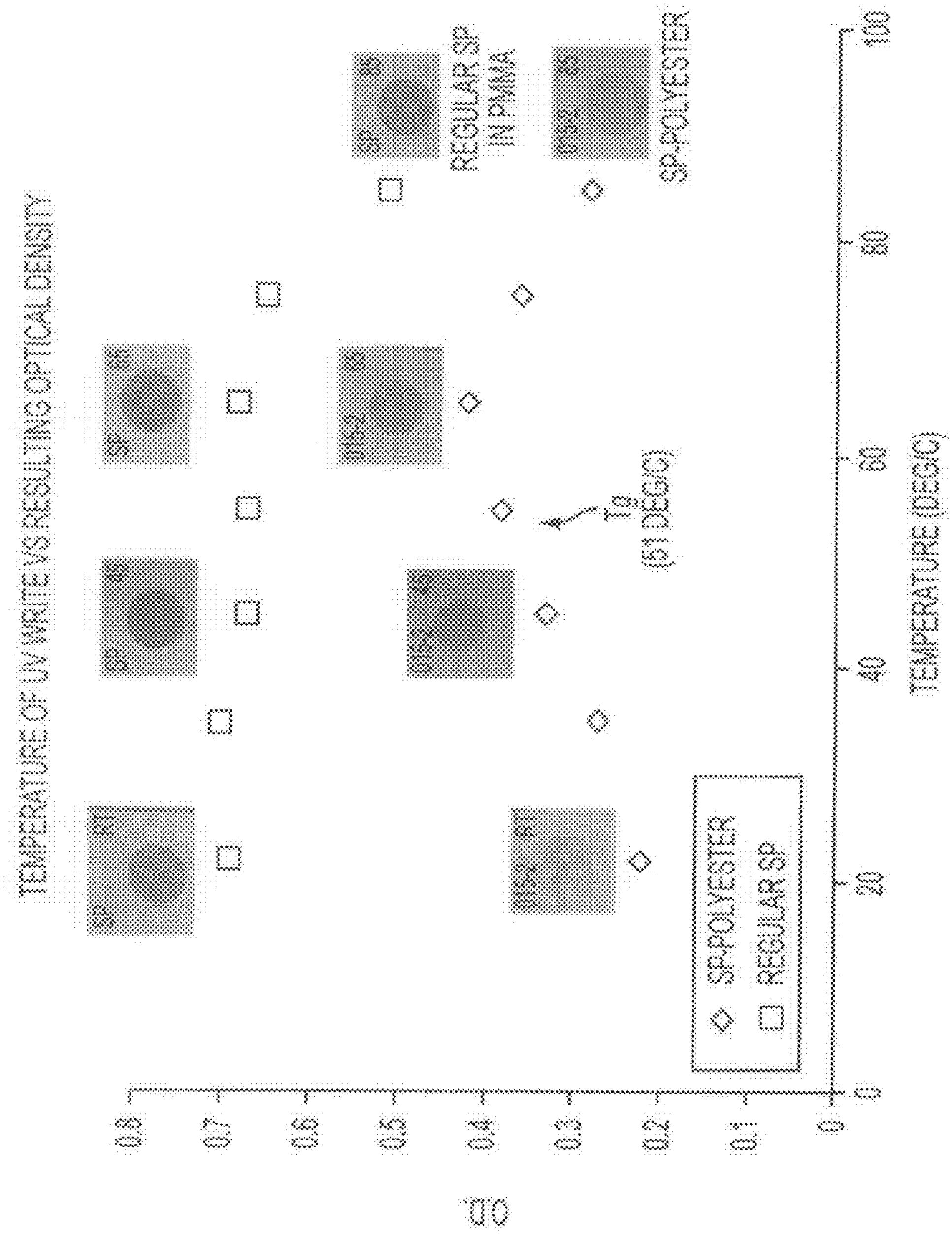
FIG. 4 is a graph of temperature during UV-imaging vs. optical density for a regular spiropyran in a polymethyl methacrylate (PMMA) matrix and the photochromic polymer in FIG. 3. Photos of media coated with the spiropyran and the photochromic polymer after UV-imaging are shown at 25° C., 45° C., 65° C., and 85° C.

FIG. 4 is a graph of temperature during UV-imaging vs. optical density for a regular small-molecule spiropyran (shown in FIG. 3) in a PMMA matrix and the photochromic polyester. In the graph, the diamonds correspond to the photochromic polyester, while the squares correspond to the small molecule spiropyran (SP). The SP in a PMMA matrix and the photochromic polyester of 5 mol % photochrome loading (dissolved in an organic solvent) were coated on 4200 paper at similar photochrome loadings.

The data shows the temperature dependency of the initial optical density of the photochromic polyester coated media up to about 70° C. and no temperature dependency for the regular SP media over the same temperature range. This is seen as the optical density increases from 0.20 to 0.45 when the temperature is raised from ambient to 70° C. while there is no change in optical density for the small molecule case over the same temperature range. This is a result of the reduced mobility of the photochromic polyester to undergo the colorless to colored conversion of the photochromic polyester in the polymer backbone at ambient and slightly elevated temperatures. Accordingly, less background coloration of the media is observed, compared to other materials with similar life times under ambient light conditions (i.e., efficient writing of the media only occurs above ambient thermal conditions which can be controlled in a printing device). Therefore, reusable, reimageable medium, according to the present disclosure, either renders a yellow film or coating unnecessary or significantly reduces the amount of yellow coating.

At temperatures above 70° C., the thermal erasure process dominates over the writing process. At these elevated temperatures, the optical density of both the SP and the photochromic polyester decreases, relative to the optical density of both the SP and the photochromic polyester at lower temperatures at which the writing process dominates. Thus, photochromic polymers having glass transition temperatures above ambient temperatures ranging from about 40° C. to about 70° C. are essential to ensure proper functioning of the thermal writing process.

Figure 5:
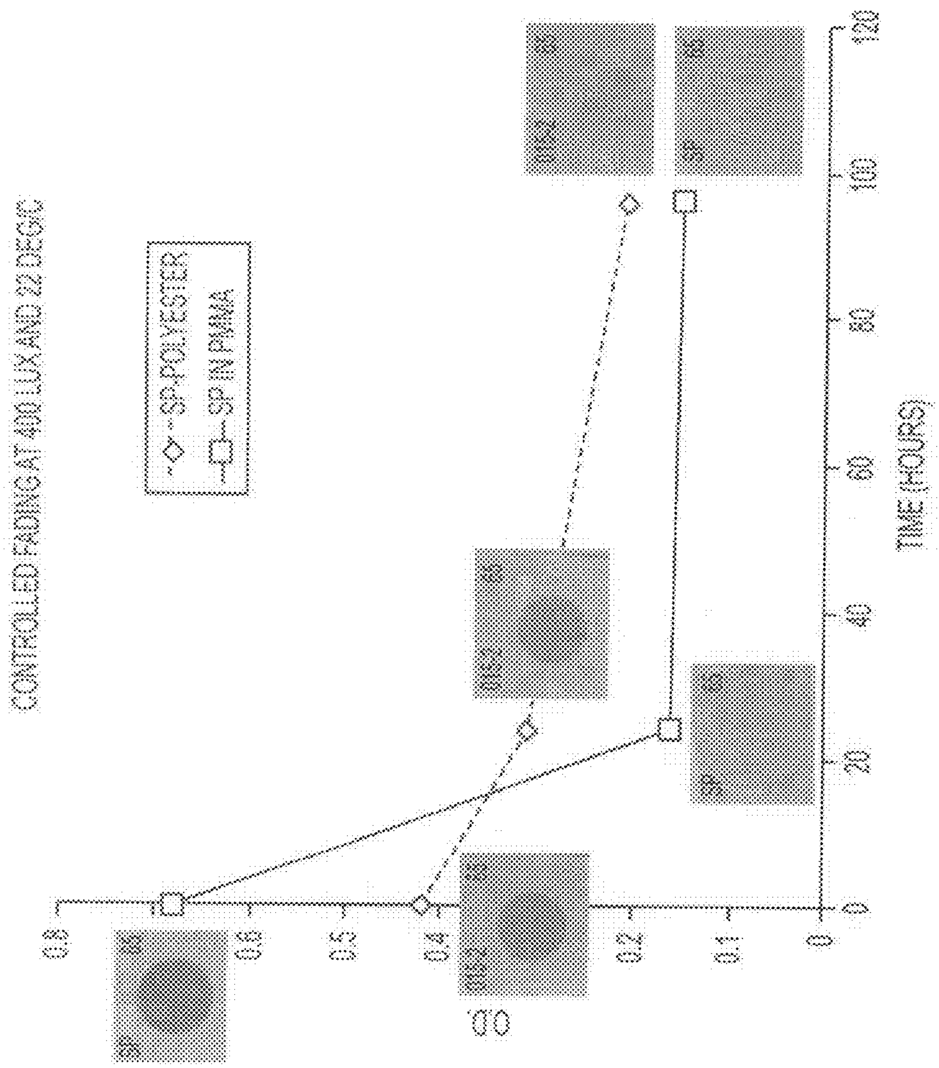
FIG. 5 is a graph of time vs. optical density under 400 lux lighting conditions after the initial UV-imaging for the regular spiropyran in PMMA matrix and the photochromic polymer in FIG. 3. Photos of media coated with the spiropyran and the photochromic polymer in FIG. 3 after UV-imaging are shown at specified time periods.

FIG. 5 is a graph of time vs. optical density under 400 lux lighting conditions after the initial UV-imaging for the regular spiropyran in PMMA matrix and the photochromic polymer in FIG. 3. After the photochromic polymer coated media undergoes UV-imaging and cooled, the mobility of the photochrome of the photochromic polymer is again reduced, thereby dramatically slowing the fading process (as shown in FIG. 5). The reduced mobility results from the covalent attachment of the photochrome within the polymer backbone. In order for the photochromic polyester to change conformation from a colored state to a colorless state, the colored photochrome must shift a portion of the polymer backbone, thereby slowing down the colored to colorless back reaction. Accordingly, the reduced mobility of the photochrome prolongs the image life by slowing the de-coloration process because the covalent attachment of the photochrome within the polymer backbone.

The initial optical density is lower for the photochromic polyester, compared to the small molecule photochrome (as shown in both FIG. 4 and FIG. 5). However, after 24 hours, the photochromic polymer image loses only 25% of its intensity, while the regular spiropyran has lost 100% of its intensity. The image life of photochromic polymer image ranges from 1 minute to 1 month, such as from 1 day to 1 week. Furthermore, UV-imaging of the photochromic polyester can be rapidly erased in about 2 to 5 seconds at 100° C. and or in about 4 minutes at 70° C., demonstrating the erasure properties of the system at elevated temperatures.

Example 2

U.S. Pat. No. 5,962,177 discloses the properties of polymers resulting from co-polymerization of 1,2-propanediol, dipropyleneglycol, and dimethylterephthalate. The resulting polymers have glass transition temperatures ranging from 21° C. to 61° C. Thus, the results demonstrate possible monomer ratios or combinations that could be used in conjunction with a photochromic monomer to form photochromic polymers with thermal properties in the desired glass transition temperature range from about 30° C. to about 150° C. By varying the monomer ratios, the glass transition temperature of the resulting photochromic polymer may be modified. For example, an exemplary monomer mole ratio for a photochromic polyester terephthalate with a moderate glass transition temperatures (i.e., ranging from 55° C.-65° C.) is 70% 1,2-propanediol, 25% dipropyleneglycol, 5% photochromic monomer (shown in FIG. 1), and 100% dimethylterephthalate. Thus, as an alternative embodiment, the reusable, reimageable may include a substrate having the following photochromic polymer structure (wherein l=25, m=70 and n=5):

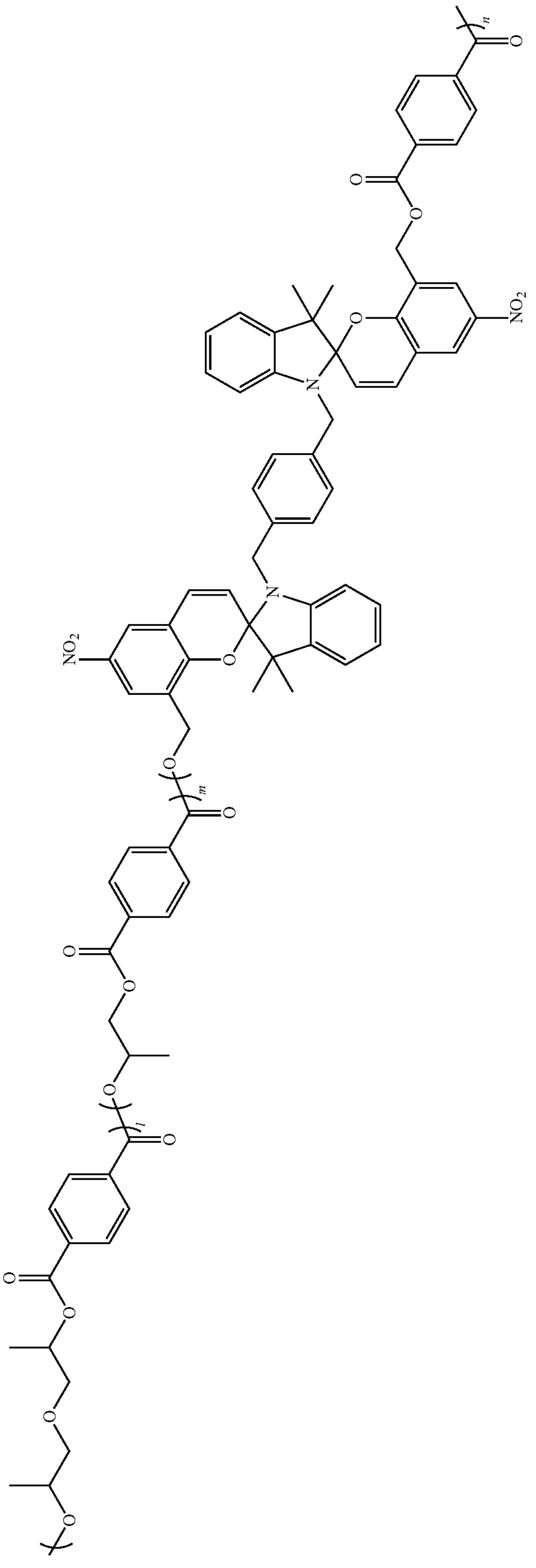

Alternatively, in the photochromic polymer (shown above), the monomer ratio of n to the sum of l and m (i.e., n/(l+m)) ranges from 0.05 to 100. Furthermore, the value of n may range from 1 to 1000, and the sum of l and m may range from 0 to 1000. In another alternative embodiment, the copolymer segments l, m, and n (shown in the photochromic polymer structure above) may be combined as a random or block copolymer. Thus, the combination of copolymer segments of the disclosed photochromic polymer is not limited to the specific combination shown above.

It is also desirable in embodiments to substitute terephthalate resins for Bis-Phenol A in the above co-polymerization, due to the fact that Bis-Phenol A is a suspected carcinogen. In alternative embodiments, other monomers may be used, including (but not limited to) dimethylisophthalate, dimethylterephthalate, isophthalic acid, terephthalic acid, phthalic acid, phthalic anhydride, ethylene glycol, propylene glycol, butylene glycol, pentylene glycol, hexylene glycol, heptylene glycol, diethylene glycol, dipropylene glycol, and cyclohexyldimethanol. Furthermore, other bis-alcohol containing photochromes may be used, including (but not limited to) as spiropyrans, spirooxazines, chromenes, spirodihydroindolizines, spiroperimidines, azobenzenes, thioindigos.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A reusable and reimageable medium comprising:

a substrate; and an imaging layer coated on or impregnated into said substrate, wherein the imaging layer comprises a photochromic polymer, wherein the photochromic polymer is prepared by polymerizing a monomer mixture, the monomer mixture comprising (a) a first monomer selected from the group consisting of terephthalic acid, dimethyl terephthalate, terphthalovl chloride, isophthalic acid, dimethyl isophthalate, isophthaloyl chloride, phthalic acid, dimethyl phthalate, phthaloyl chloride, and mixtures thereof, and (b) a second monomer selected from the group consisting of ethylene glycol, propylene glycol, butylene glycol, pentylene glycol, hexylene glycol, heptylene glycol, diethylene glycol, dipropylene glycol, cyclohexydimethanol, and mixtures thereof, wherein the photochromic polymer has a glass transition temperature ranging from about 30° C. to about 150° C., and wherein at least a part of the imaging layer converts to a colored state when both UV light and temperatures ranging from about 30° C. to about 100° C. are applied to the coated substrate.

2. The reusable and reimageable medium according to claim 1, wherein the photochromic polymer comprises a photochromic moiety that is covalently bound to a polymer backbone.

3. The reusable and reimageable medium according to claim 1, wherein the photochromic polymer comprises a spiropyran group, a spirooxazine group, a chromene group, a spirodihydroindolizine group, a spiroperimidine group, an azobenzene group, a thioindigo group, or a group having the following formula:

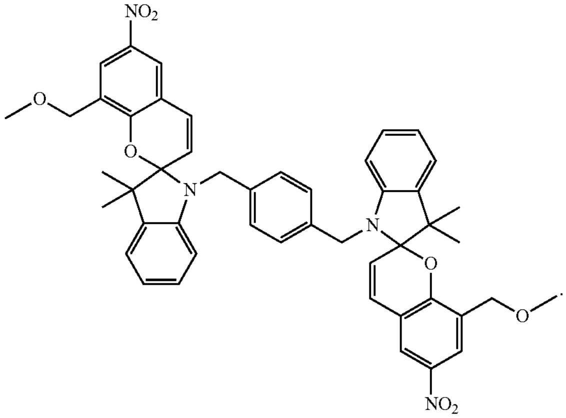

4. A reusable and reimageable medium comprising:

a substrate selected from the group consisting of plain paper, coated paper, clear plastic, translucent plastic, opaque plastic, no tear paper, and mixtures thereof: and an imaging layer coated on or impregnated into the substrate, wherein the imaging layer comprises a photochromic polymer, wherein the photochromic polymer has a glass transition temperature ranging from about 30° C. to about 150° C., wherein at least a part of the imaging layer converts to a colored state when both UV light and temperatures ranging from about 30° C. to about 100° C. are applied to the coated substrate, wherein the photochromic polymer is a block copolymer having the following general formula:

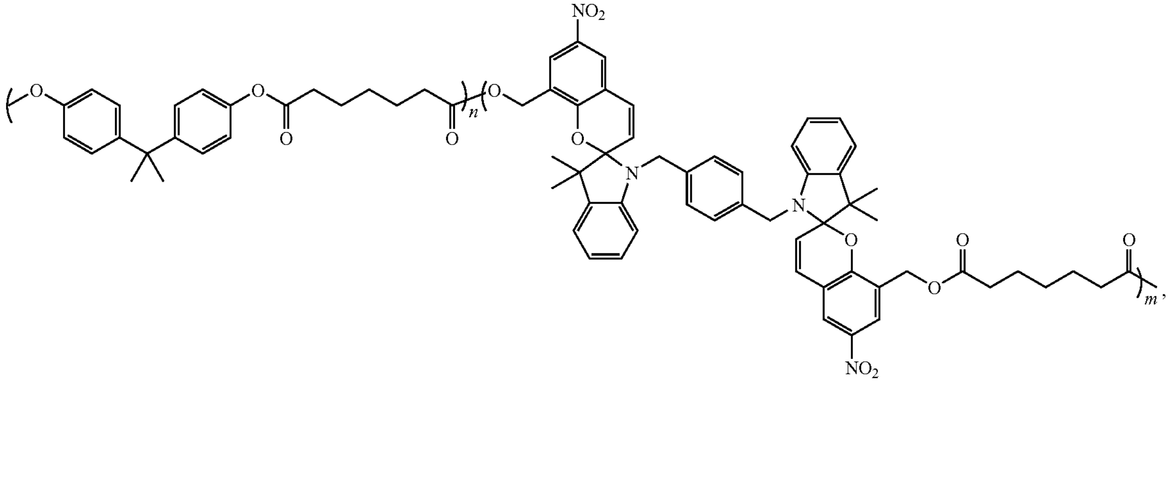

, and wherein a value of m ranges from 1 to 1000, and a value of n ranges from 0 to 1000.

5. The reusable and reimageable medium according to claim 1, wherein the substrate is selected from the group consisting of plain paper, coated paper, clear plastic, translucent plastic, opaque plastic, no tear paper, and mixtures thereof.

6. The reusable and reimageable medium according to claim 1, wherein the imaging layer reverts to a colorless state at temperatures of about 70° C. and above.

7. A method of producing the reusable and reimageable medium according to claim 1, the method comprising:

coating the substrate with a coating composition comprising the photochromic polymer.

8. The method according to claim 7, wherein the photochromic polymer comprises a photochromic moiety that is covalently bound to a polymer backbone.

9. The method according to claim 7, wherein the photochromic polymer comprises a spiropyran group, a spirooxazine group, a chromene group, a spirodihydroindolizine group, a spiroperimidine group, an azobenzene group, a thioindigo group, or a group having the following formula:

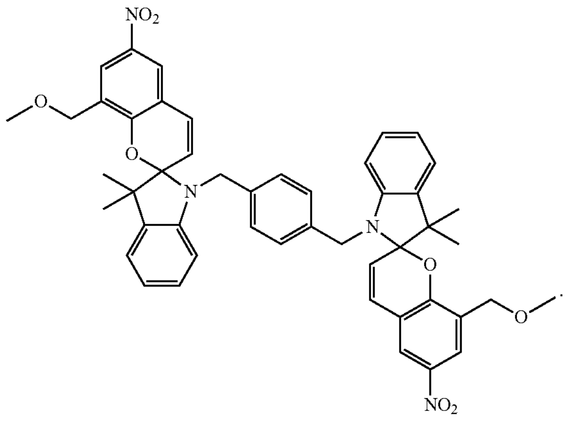

10. The method according to claim 7, wherein the substrate is selected from the group consisting of plain paper, coated paper, clear plastic, translucent plastic, opaque plastic, no tear paper, and mixtures thereof.

11. The method according to claim 7, wherein the imaging layer reverts to a colorless state at temperatures of about 70° C. and above.

12. A method of using a reusable and reimageable medium, the method comprising:

applying both UV light and temperatures ranging from about 30° C. to about 100° C. to a substrate coated with a photochromic polymer, thereby converting at least a part of the coated substrate to a colored state, and heating the at least partially colored coated substrate at a temperature greater than about 70° C., thereby causing the coated substrate to revert to a colorless state, wherein the photochromic polymer is prepared by polymerizing a monomer mixture, the monomer mixture comprising (a) a first monomer selected from the group consisting of terephthalic acid, dimethyl terephthalate, terphthaloyl chloride, isophthalic acid, dimethyl isophthalate, isophthaloyl chloride, phthalic acid, dimethyl phthalate, phthaloyl chloride, and mixtures thereof, and (b) a second monomer selected from the group consisting of ethylene glycol, propylene glycol, butylene glycol, pentylene glycol, hexylene glycol, heptylene glycol, diethylene glycol, dipropylene glycol, cyclohexyldimethanol, and mixtures thereof, and wherein the photochromic polymer has a glass transition temperature ranging from about 30° C. to about 150° C.

13. The method according to claim 12, wherein the photochrornic polymer comprises a photochromic moiety that is covalently bound to a polymer backbone.

14. The method according to claim 12, wherein the photochromic polymer comprises a spiropyran group, a spirooxazine group, a chromene group, a spirodihydroindolizine group, a spiroperimidine group, an azobenzene group, a thioindigo group, or a group haying the following formula:

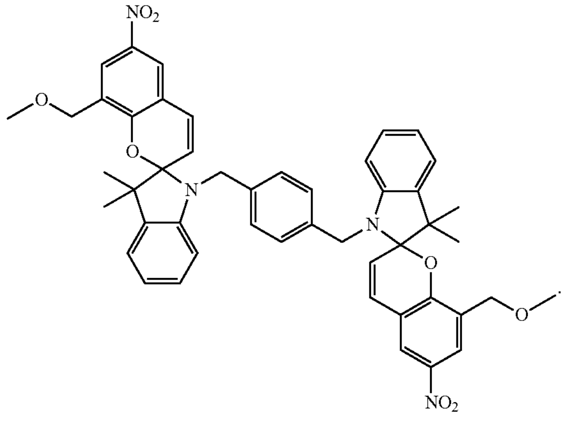

15. A method of producing the reusable and reimageable medium according to claim 4, the method comprising:

coating the substrate with a coating composition comprising the photochromic polymer.

16. A method of using the reusable and reimageable medium according to claim 4, the method comprising:

applying both UV light and temperatures ranging from about 30° C. to about 100° C. to the substrate coated with the photochromic polymer, thereby converting at least a part of the coated substrate to a colored state, and heating the at least partially colored coated substrate at a temperature greater than about 70° C., thereby causing the coated substrate to revert to a colorless state.

* * * * *